(12) United States Patent
Mizokami

(10) Patent No.: US 10,819,231 B2
(45) Date of Patent: Oct. 27, 2020

(54) DC-DC CONVERTER, POWER CONDITIONER, AND POWER SYSTEM

(71) Applicant: OMRON Corporation, Kyoto-shi, Kyoto (JP)

(72) Inventor: Takao Mizokami, Ritto (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 16/615,145

(22) PCT Filed: Feb. 27, 2018

(86) PCT No.: PCT/JP2018/007131
§ 371 (c)(1),
(2) Date: Nov. 20, 2019

(87) PCT Pub. No.: WO2019/012731
PCT Pub. Date: Jan. 17, 2019

(65) Prior Publication Data
US 2020/0177080 A1    Jun. 4, 2020

(30) Foreign Application Priority Data
Jul. 11, 2017    (JP) .................................. 2017-135394

(51) Int. Cl.
*H02M 7/48*    (2007.01)
*H02M 3/156*    (2006.01)
(Continued)

(52) U.S. Cl.
CPC ............ *H02M 3/156* (2013.01); *H02J 1/102* (2013.01); *H02J 3/46* (2013.01); *H02M 7/48* (2013.01);
(Continued)

(58) Field of Classification Search
CPC ............ H02M 5/40; H02M 5/42; H02M 5/44; H02M 5/443; H02M 5/45; H02M 5/4505;
(Continued)

(56) References Cited

U.S. PATENT DOCUMENTS

2004/0070376 A1    4/2004    Hoshino et al.
2012/0043823 A1    2/2012    Stratakos et al.
(Continued)

FOREIGN PATENT DOCUMENTS

| JP | H8-275534 A | 10/1996 |
| JP | 2002-10496 A | 1/2002 |

(Continued)

OTHER PUBLICATIONS

English translation of the International Search Report("ISR") of PCT/JP2018/007131 dated May 22, 2018.
(Continued)

*Primary Examiner* — Bryan R Perez
(74) *Attorney, Agent, or Firm* — Metrolex IP Law Group, PLLC

(57) ABSTRACT

A DC-DC converter includes: a positive-side capacitor connected to a positive-electrode-side output terminal; a negative-side capacitor with one end thereof connected to the positive-side capacitor and the other end thereof connected to a negative-electrode-side output terminal; an inductor with one end thereof connected to the positive-electrode-side output terminal and an input-side end thereof opposite thereto connected to the negative-electrode-side output terminal, the inductor including a center tap between the end near the positive-electrode-side output terminal thereof and the input-side end; and a switching element with one end thereof connected to the input-side end of the inductor and the other end thereof connected to a positive electrode of a solar cell; a negative electrode of the solar cell connected to (Continued)

a region between the positive-side capacitor and the negative-side capacitor and to the center tap of the inductor.

6 Claims, 8 Drawing Sheets

(51) Int. Cl.
    *H02J 1/10*       (2006.01)
    *H02J 3/46*       (2006.01)
    *H03K 17/10*     (2006.01)
    *H02M 7/537*    (2006.01)
    *H02M 1/00*     (2006.01)

(52) U.S. Cl.
    CPC .......... *H02M 7/537* (2013.01); *H03K 17/102* (2013.01); *H02M 2001/007* (2013.01); *H02M 2001/009* (2013.01)

(58) Field of Classification Search
    CPC ...... H02M 5/451; H02M 5/452; H02M 5/458; H02M 5/4585; H02M 5/293; H02M 5/297; H02M 5/275; H02M 5/22; H02M 7/42; H02M 7/48; H02M 7/487; H02M 7/501; H02M 7/4826; H02M 7/497; H02M 7/49; H02M 7/4807; H02M 7/537; H02M 7/5387; H02M 7/53; H02M 7/533; H02M 7/53871; H02M 2007/4803; H02M 2007/4822
    See application file for complete search history.

(56) References Cited

U.S. PATENT DOCUMENTS

| | | | |
|---|---|---|---|
| 2013/0229839 A1* | 9/2013 | Escobar | .................. H02M 1/12 363/40 |
| 2014/0320107 A1 | 10/2014 | Takahashi et al. | |
| 2017/0062647 A1 | 3/2017 | Ellis-Monaghan et al. | |
| 2017/0075405 A1 | 3/2017 | Jensen et al. | |

FOREIGN PATENT DOCUMENTS

| | | |
|---|---|---|
| JP | 2004-135442 A | 4/2004 |
| TW | 200601661 A | 1/2006 |
| TW | 201230293 A | 7/2012 |
| TW | 201631877 A | 9/2016 |
| WO | 2014/125602 A1 | 8/2014 |

OTHER PUBLICATIONS

Written Opinion("WO") of PCT/JP2018/007131 dated May 22, 2018.

Taiwanese Office Action dated Sep. 19, 2018 in a counterpart Taiwanese Patent application.

* cited by examiner

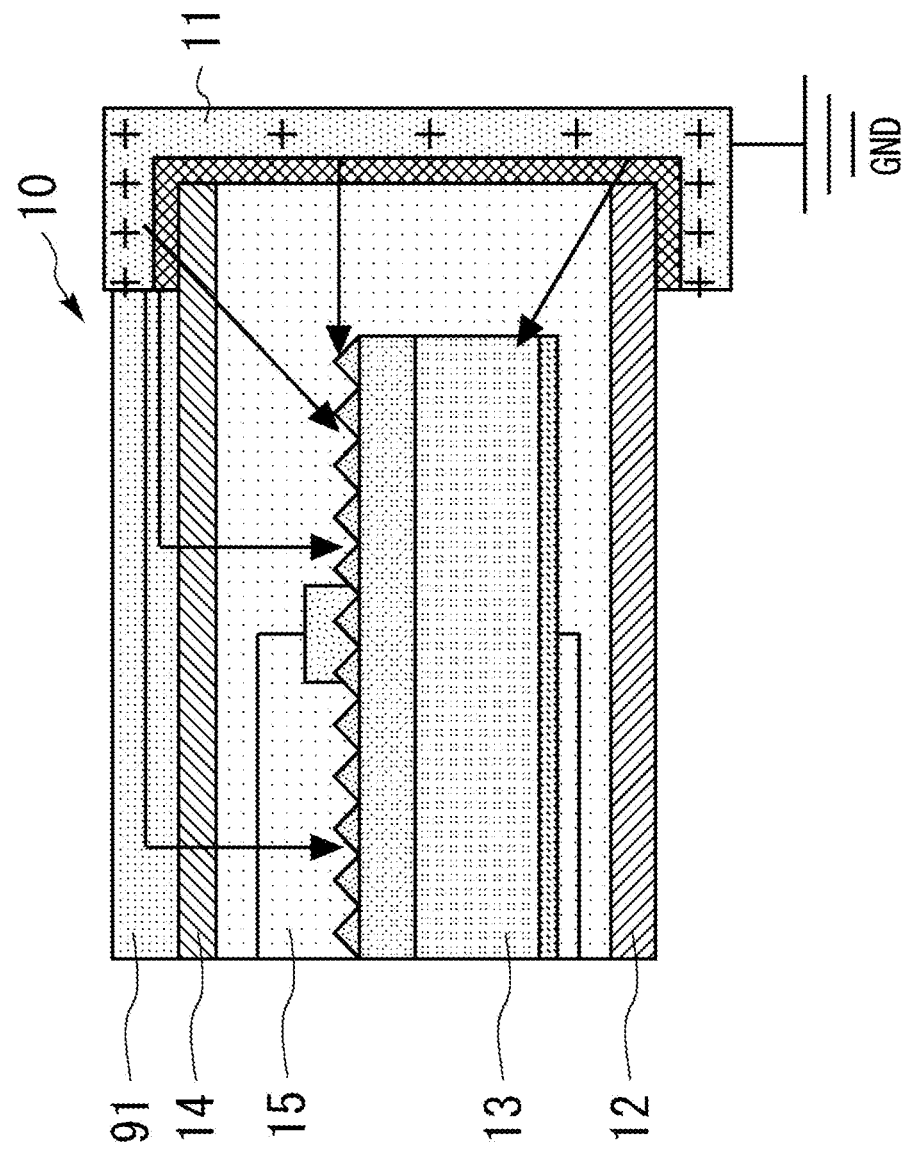

DC-DC CONVERTER, POWER CONDITIONER, AND POWER SYSTEM

FIELD

The present invention relates to a DC-DC converter, a power conditioner, and a power system.

BACKGROUND

In a solar power system, which uses light from the sun to generate electricity, a solar cell is connected to a commercial power grid or load device via a power conditioner that includes an inverter; the solar cell provides the electricity generated in the solar cell to the commercial power grid or a load device. Patent Document 1 discloses a power conditioner configured to boost an input voltage using a boost circuit for supply to an inverter when the input voltage from the solar cell is less than a predetermined voltage.

Solar power systems have in recent years been configured for higher voltages; and, given the increased efficiency of inverters, the solar power system may also be configured without transformers. The configurations have resulted in cases where there is a large potential difference between the solar cell and a frame that is grounded. It is known that the difference in potential generates a leakage current and, with the presence of external factors such as humidity and temperature, i.e., high temperature and high humidity, may cause potential induced degradation (PID).

FIG. 8 is a conceptual diagram for describing one example of the PID phenomenon. FIG. 8 shows a single solar cell string 10 within a solar cell array in a solar power system. The solar cell string 10 is connected in series with a plurality of solar cell modules 1 (i.e., a solar panel) and to a commercial power grid via a power conditioner 30. That is, each of the solar cell modules 1 in the solar cell string 10 receives light from the sun in the daytime and generates electricity, and thereby generates a potential difference between a positive input terminal 311 and a negative input terminal 312.

FIG. 9 schematically illustrates the structure of a solar cell module 1. As illustrated in FIG. 9, the solar cell module 1 includes a frame 11, a backsheet 12, a cell 13, glass 14, and a sealing material 15.

The cell 13 includes a semiconductor layer (e.g., a photoelectric layer) that uses the photovoltaic effect to convert light energy to electricity. The light receiving side of the cell 13 is provided with the glass 14, while the non-receiving side is provided with the backsheet 12. The sealing material 15 fills between the glass 14 and backsheet 12, and the cell 13, sealing the cell 13. The frame 11 is provided on the external periphery of the solar cell module 1 and is used as a support stage or the like for securing the solar cell module 1 at installation. The frame is also made of a conductive metal and is grounded.

As illustrated in FIG. 8, the potential-to-ground of the cells 13 in the solar cell modules 1 connected in series is positive at the solar cell module 1 closer to the input terminal 311 and negative closer to the solar cell module 1 at the input terminal 312. If this potential-to-ground increases and, as illustrated by the arrow in FIG. 9, a leakage current is generated between the cell 13 in the solar cell module 1 and the frame 11, or between the moisture 91 clinging on the surface of the glass and the cell 13, the sodium ions in the glass 14 move to the cell 13 inhibiting the migration of elections and reducing the performance of the cell 13. In other words, PID occurs. The cell in the solar cell module 1 may be a p-type semiconductor; in this case, the cell tends to exhibit a decline in performance when the potential-to-ground is negative. The cell in the solar cell module 1 may be an n-type semiconductor; in this case, the cell tends to exhibit a decline in performance when the potential-to-ground is positive.

RELATED ART DOCUMENTS

Patent Documents

[Patent Document 1] Japanese Patent Publication No. 2002-10496

SUMMARY

Technical Problem

The decline in performance due to PID becomes more striking as the potential-to-ground for the solar cell module 1 increases. Therefore, the decline in performance due to PID is becoming more of a problem as the solar power system is configured to supply higher and higher voltages.

Therefore, the present invention aims to provide a means prevent PID from reducing the performance of the solar cell.

Solution to Problem

To address the above described problems, embodiments of the present invention include a DC-DC converter includes:

a positive-side capacitor with one end thereof connected to a positive-electrode-side output terminal;

a negative-side capacitor with one end thereof connected to the positive-side capacitor and the other end thereof connected to a negative-electrode-side output terminal, the negative-side capacitor provided in series with the positive-side capacitor between the positive-electrode-side output terminal and the negative-electrode-side output terminal;

an inductor with one end thereof connected to the positive-electrode-side output terminal and the positive-side capacitor, and an input-side end thereof opposite to the end of the inductor near the positive-electrode-side output terminal connected to the negative-electrode-side output terminal and the negative-side capacitor, the inductor including a center tap between the end near the positive-electrode-side output terminal and the input-side end; and a switching element with one end thereof connected to the input-side end of the inductor and the other end thereof connected to a positive electrode of a solar cell, the switching element controlled ON and OFF to switch between conducting and blocking the power entering from the solar cell; wherein a negative electrode of the solar cell is connected to a region between the positive-side capacitor and the negative-side capacitor and to the center tap of the inductor;

when the switching element is set to an ON state, the DC-DC converter supplies the current flowing from the solar cell to the inductor with the energy accumulating in the inductor;

when the switching element is set to an OFF state, the DC-DC converter discharges the energy in the inductor to supply power to a load connected to the positive-electrode-side output terminal and the negative-electrode-side output terminal and to charge the positive-side capacitor and the negative-side capacitor; and when the switching element is set to an ON state, the DC-DC converter supplies the power discharged from the positive-side capacitor and the negative-side capacitor to a load connected to the positive-electrode-side output terminal and the negative-electrode-side output terminal.

A DC-DC converter thusly configured according to embodiments of the present invention ensures that the earth potential is substantially equal to the midpoint potential between the positive-side capacitor and the negative-side capacitor, or is outside a range that would cause PID when the direct current power supplied from the positive-electrode-side output terminal and the negative-electrode-side output terminal is converted to alternating-current power; this ensures that the potential of the negative terminal of the solar cell which is connected at the midpoint of the positive-side capacitor and the negative-side capacitor is not negative relative to the earth potential and prevents PID from occurring.

The DC-DC converter establishes the duty cycle of the switching element as less than a predetermined value to thereby reduce the input voltage from the solar cell.

With this configuration, a DC-DC converter according to embodiments of the present invention reduces the voltage even when the solar cell supplies a high input voltage thereto and thus minimizes the decrease in the electrical conversion efficiency.

An embodiment of the present invention may be a power conditioner including the DC-DC converter and an inverter configured to convert the direct current power supplied from the DC-DC converter to alternating current power and output the alternating current power.

Further, an embodiment of the present invention may be a power system including a solar cell, the DC-DC converter, and an inverter configured to convert the direct current power supplied from the DC-DC converter to alternating current power and output the alternating current power.

Effects

Embodiments of the present invention provides means to prevent PID from reducing the performance of the solar cell.

BRIEF DESCRIPTION OF THE DRAWINGS

FIG. 3 illustrates the flow of current when the switching element is set to ON;
FIG. 9 schematically illustrates the structure of a solar cell module.

DETAILED DESCRIPTION

Embodiments adopting the aforementioned concepts are described below with reference to the drawings.

Figure 1:
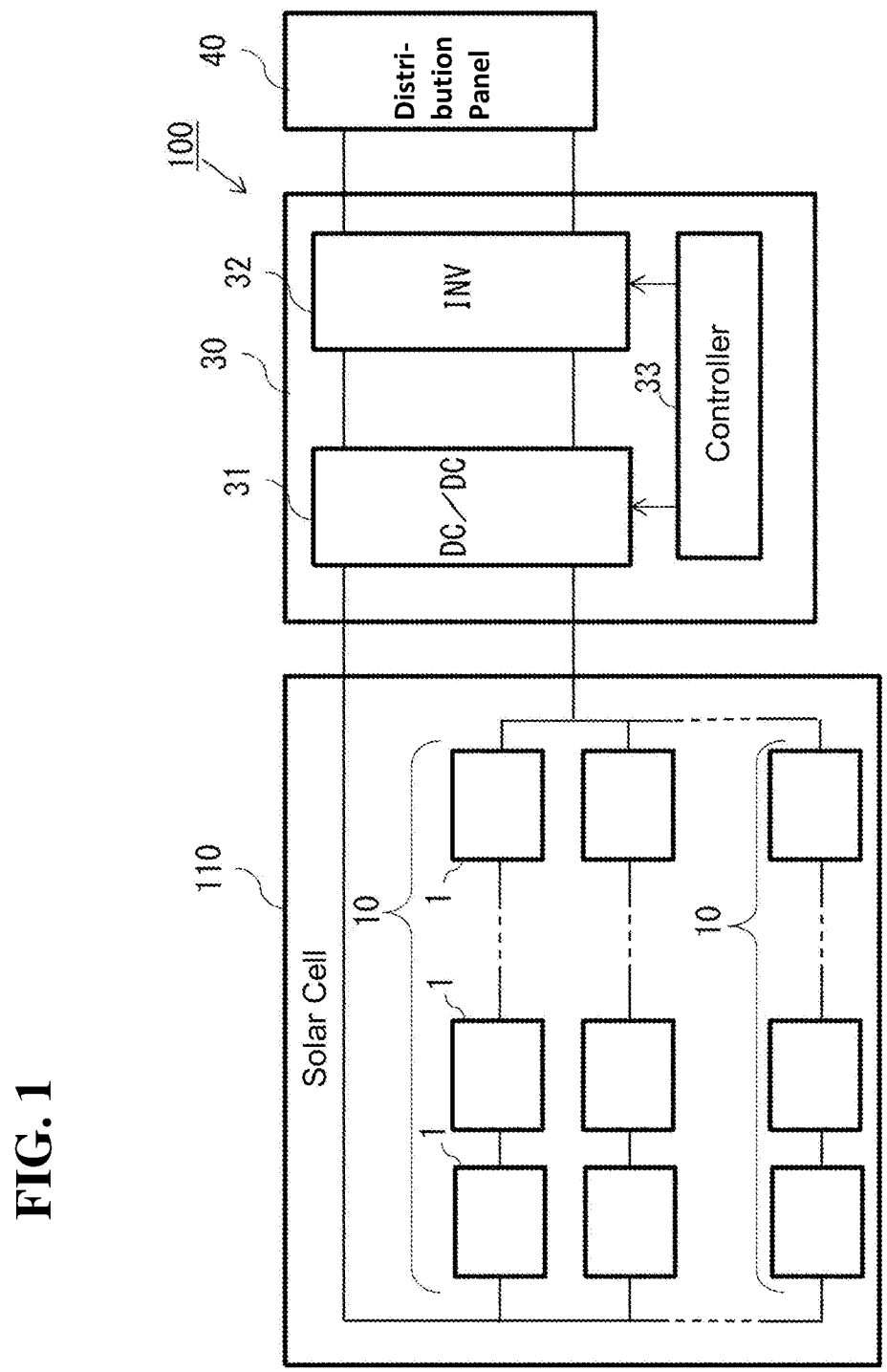
FIG. 1 illustrates a configuration of a power system.

FIG. 1 illustrates a configuration of a power system according to an embodiment; A power system 100 (FIG. 1) includes a solar cell 110 and a power conditioner 30 (also referred to below as a power conditioning system, PCS); the power system 100 is connected to a commercial power grid or a load device via a distribution panel 40.

A solar cell 110 is configured from a plurality of solar cell strings 10 connected in parallel where a solar cell string 10 is a plurality of solar cell modules 1 connected in series. Each of the solar cell modules 1 converts solar energy to electrical energy via the photovoltaic effect and outputs direct current power. The solar cell module 1 is a known configuration where a panel with a cell 13 sealed between a glass 14 and a backsheet 12 are held in a frame 11 as depicted in FIG. 9. While a cell 13 is schematically illustrated in FIG. 9, a solar cell module 1 may contain a plurality of cells 13 that are connected in series via an electrode pattern 16 with a plurality of the cells connected in series further connected in parallel. The cells 13 are connected to the output terminal of the solar cell module 1 (not shown), with the electricity generated from each cell 13 output to said output terminal. The frame 11 is grounded separately from the internal circuitry of the cells 13. This creates a potential difference (potential-to-ground) between the frame 11 and the cell 13, and the PID from this potential relative to ground is prevented as is later described.

The power conditioner 30 includes a DC-DC converter 31 that converts (and in this example boosts) the output from the solar cell 110 to a predetermined direct current voltage, and an inverter circuit 32 that converts the direct-current power output from the DC-DC converter 31 into alternating current power. The power conditioner 30 supplies the alternating current power output from the inverter circuit 32 to a commercial power grid or a load device. The power conditioner 30 may also be provided with a grid connection relay or the like for controlling grid connection to and disconnection from a commercial power grid.

Figure 2:
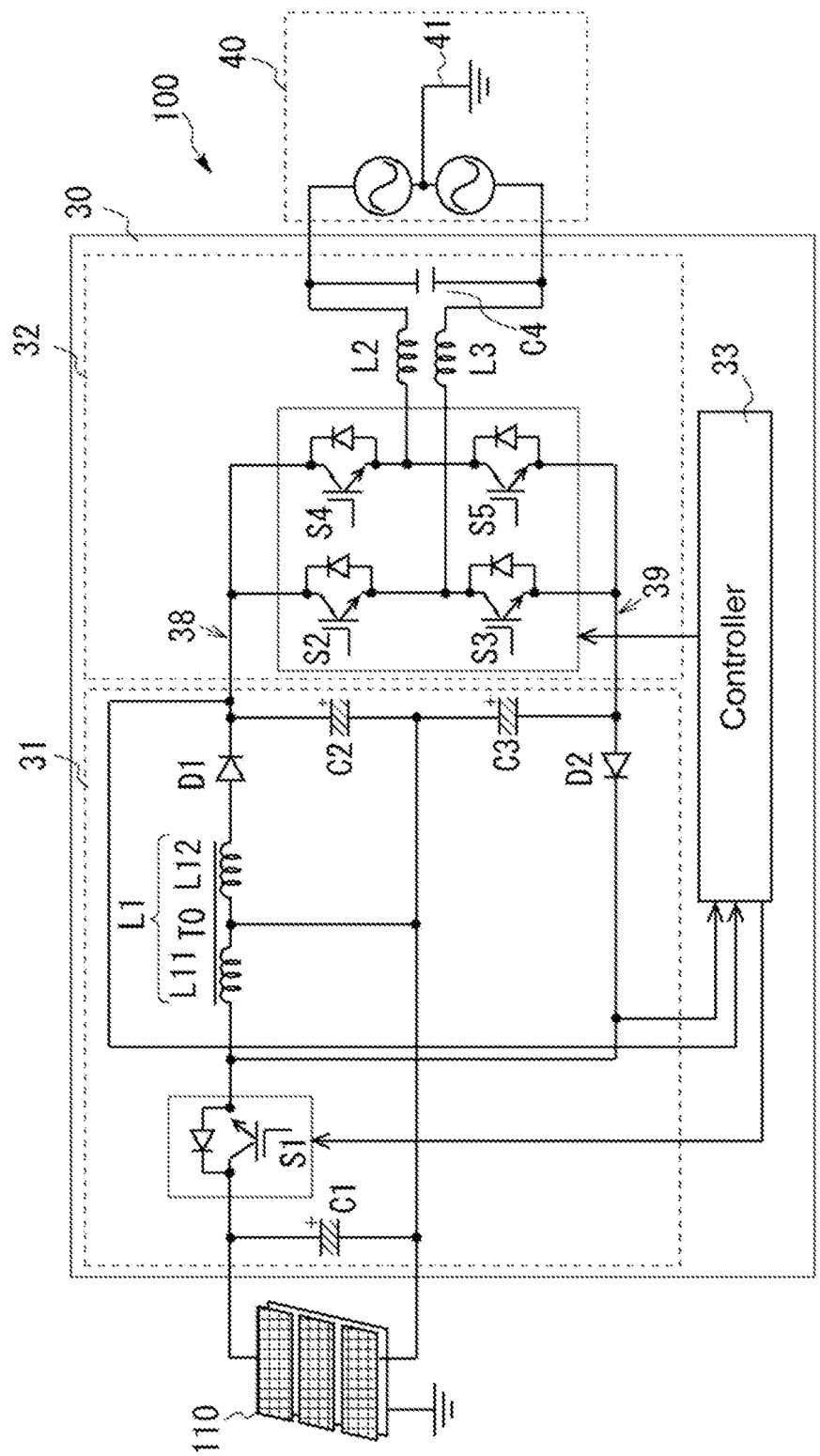
FIG. 2 illustrates a circuit configuration of a power system.

FIG. 2 illustrates a circuit configuration of a power system 100 according to an embodiment; the DC-DC converter 31 connected to the solar cell 110 is a non-isolating boost circuit containing an inductor L1, a boost switching element S1, diodes D1, D2, and capacitors C1, C2, C3.

The smoothing capacitor C1 is connected in parallel with the solar cell 110 and smooths the voltage in the power entering the DC-DC converter 31 from the solar cell 110.

The switching element S1 is configured with one end connected to the positive electrode of the solar cell 110 and the other end connected to the inductor L1. Driven by a controller 33, the switching element S1 performs switching and provides boosting by intermittently exciting the inductor L1.

The switching element S1 may be a metal-oxide semiconductor (MOS) type field effect transistor, an insulated gate type bipolar transistor (IGBT), a bipolar transistor, a thyristor, or the like. That is, any device capable of carrying out switching. In this example, the switching element S1 is an IGBT.

One end of the inductor L1 is connected to the switching element S1 and the other end is connected to the anode of a diode D1. The inductor L1 includes a tap T0 at the center and below, "inductor L11" refers to between the end of the inductor L1 near the switching element S1 and the tap T0, and "inductor L12" refers to between the end of the inductor L1 near the diode D1 and the tap T0. In this embodiment the inductor L11 and the inductor L12 are tightly coupled with the same number of turns wound about the same core. The number of turns for the inductors L11, L12 are not particularly limited. The tap T0 is connected partway along a line between the capacitor C2 and capacitor C3, and the negative electrode of the solar cell 110. That is, the tap T0 is connected to a region between the capacitor C2 and capacitor C3, and to the negative electrode of the solar cell 110.

The diode D1 rectifies the current to the positive electrode side with the anode connected to the inductor L1, and the cathode connected to the high electrical-potential end of the capacitor C2 and the positive electrode of the inverter circuit 32.

The end of the capacitor C2 on the high electrical potential side is connected to the cathode of the diode D1 and the positive electrode of the inverter circuit 32, with the other end connected to the negative side of the capacitor C3. The capacitor C2 is also referred to as the positive-side capacitor below. The end of the capacitor C3 on the high electrical potential side is connected to the positive-side capacitor C2, and the other end is connected to the negative electrode of the inverter circuit 32 and the anode of the diode D2. That is, the negative-side capacitor C3 is connected in series with the positive-side capacitor C2 between the positive electrode side DC bus 38 and the negative electrode side DC bus 39. The capacitor C3 is also referred to as the negative-side capacitor below. In the embodiment, the capacitors C2, C3 are electrical-field capacitors of the same capacity and smooth the power entering the inverter circuit 32.

The diode D2 rectifies the current to the negative side with the cathode thereof connected to the inductor L1 and the anode thereof connected to the low electrical-potential end of the negative-side capacitor C3 used for smoothing and the negative electrode of the inverter circuit 32.

The DC-DC converter 31 boosts the direct current voltage (e.g., 200V) entering from the solar cell 110 to a predetermined voltage (e.g., 300 V) through the operation of the switching element S1.

The inverter circuit 32 is provided with switching elements S2-S5, inductors L2, L3, and a capacitor C4. The inverter circuit 32 converts the direct current power entering from the DC-DC converter 31 into alternating current power and outputs the alternating current power to the commercial power grid or a load device via a distribution panel 40.

The switching elements S2 through S5 create a bridge. For example, the switching element S2 and the switching element S3 are connected between the positive and negative electrodes of the inverter circuit 32; the switching elements S2, S3 are connected in parallel with the switching element S4 and the switching element S5 which are connected between the positive and negative electrodes of the inverter circuit 32. One end of the inductor L2 is connected between the switching element S4 and the switching element S5 with the other end connected to one of the output terminal of the inverter circuit 32. One end of the inductor L3 is connected between the switching element S2 and the switching element S3 with the other end connected to a different output terminal of the inverter circuit 32. The capacitor C4 is connected between the output terminals of the inverter circuit 32. Note that the inverter circuit 32 is not limited to this configuration, and may use any known configuration. In this embodiment, an example of a single-phase inverter circuit is presented, however, the inverter circuit may have a two-phase or three-phase configuration.

The controller 33 controls the states of the switching elements S2 through S5; for example, the controller 33 may set the switching element S4 and the switching element S3 to the OFF state when setting the switching element S2 and the switching element S5 to the ON state; the controller 33 may also set the switching element S4 and the switching element S3 to the ON state when setting the switching element S2 and the switching element S5 in the OFF state. The controller may thus convert the direct current power entering from the DC-DC converter 31 to alternating current power by alternating the states of the switching elements.

Figure 3:
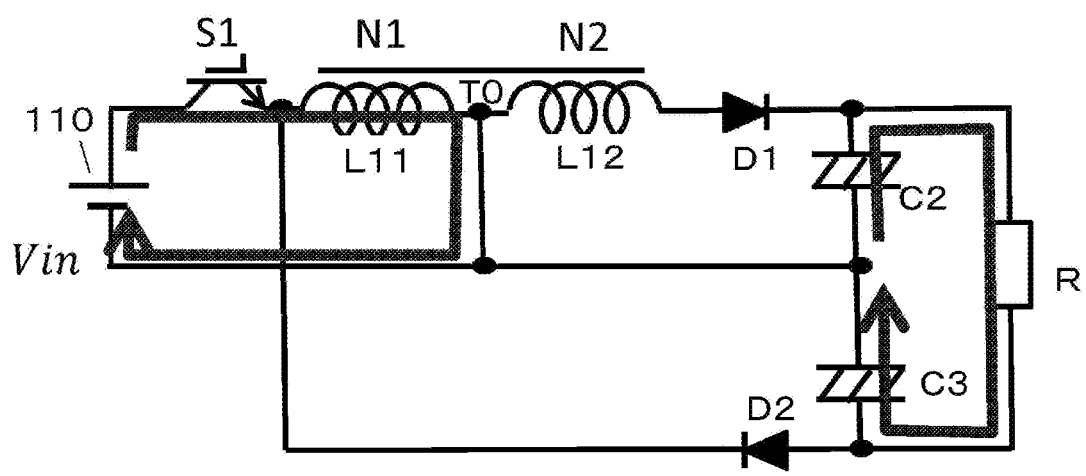
Figure 4:
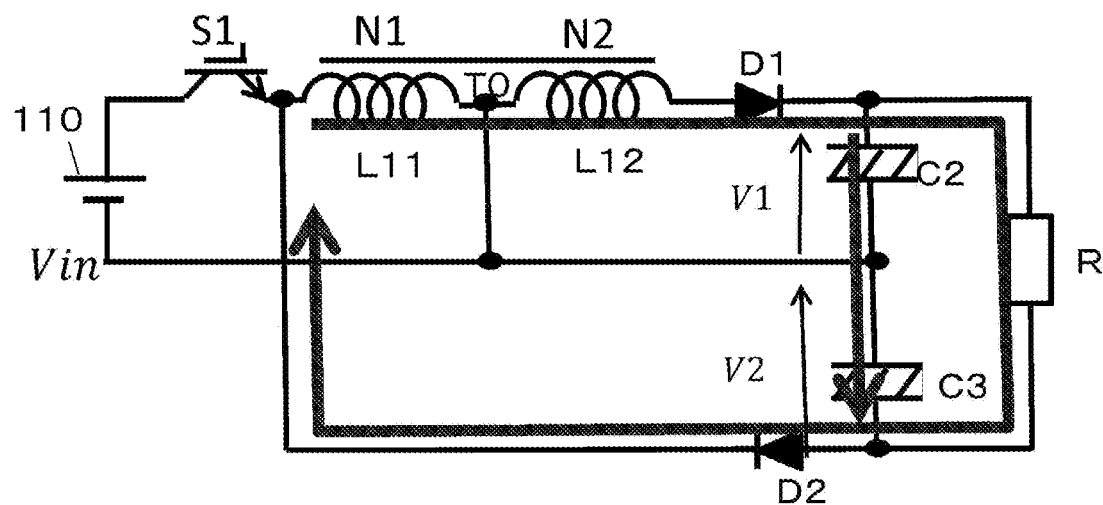
FIG. 4 illustrates the flow of current when the switching element is set to OFF.

The operations of the DC-DC converter 31 is described next. FIG. 3 illustrates the flow of current when the switching element S1 is set to ON; FIG. 4 illustrates the flow of current when the switching element is set to OFF. Note that in FIG. 3 and FIG. 4, the symbol Vin represents the voltage of the solar cell 110, symbols N1, N2 represent the number of turns of the inductors L11, L12 respectively, and the symbol R represents a load connected to a terminal on the output side of the DC-DC converter 31 via the inverter circuit 32. FIG. 3 and FIG. 4 also illustrate the flow of current when N1 and N2 are equal.

The current entering the DC-DC converter 31 from the solar cell 110 flows into the inductor L11 when the controller 33 sets the switching element S1 to ON as illustrated in FIG. 3, and energy accumulates in the inductor L11. At this time the discharge of the capacitors C2, C3 causes current to flow from the capacitors C2, C3 to the load R. Therefore, the current flowing to the inductor L11 does not flow toward the inductor L12 but flows to the negative electrode of the solar cell 110 via the tap T0.

In contrast, as illustrated in FIG. 4, given the energy accumulated in the inductor L11, the current flows to the load R from the inductor L12 via the diode D1 and to the inductor L11 via the diode D2 when the controller 33 sets the switching element S1 to OFF. The current from the inductor L12 also charges the capacitors C2, C3. At this time, given the voltage applied to the positive-side capacitor C2 as V1 and the voltage applied to the negative-side capacitor C3 as V2, the voltages V1, V2 are the value as expressed in Formula 1 and Formula 2 below. Note that Don represents the duty cycle of the switching element S1, that is, the proportion of time that the switching element S1 is set to ON during its drive time.

$$V1 = \frac{N2}{N1} \frac{Don}{1-Don} Vin \qquad \text{Formula 1}$$

$$V2 = \frac{Don}{1-Don} Vin \qquad \text{Formula 2}$$

As illustrated in Formula 1 and Formula 2, the voltage V1 is the ratio between the number of turns N1 in the inductor L11 and the number of turns N2 in the inductor L12 multiplied by the voltage V2. Therefore, the voltage V1 and the voltage V2 are the same value if the number of turns N1 and the number of turns N2 are the same. That is, V1 equals V2 when N1 equals N2.

As illustrated in FIG. 2, relative to earth 41, the voltage of the positive electrode side DC bus 38 is (V1+V2)/2, and relative to earth 41 the voltage of the negative electrode side DC bus 39 is −(V1+V2)/2. Accordingly, the potential at the negative electrode of the solar cell 110, which is connected between the positive-side capacitor C2 and the negative-side capacitor C3 is equivalent to the potential at earth 41 when V1=V2. If, for instance, the solar cell module 1 uses a p-type semiconductor, a negative potential (i.e., the potential-to-ground) between the frame and the solar cell module causes PID to occur; therefore, making the potential at the negative electrode of the solar cell 110 and the potential at the earth 41 equal prevents PID from reducing the performance of the solar cell.

Moreover, the DC-DC converter 31 of the embodiment establishes the duty cycle of the switching element S1 which allows for a configuration that increases or reduces the voltage entering from the solar cell 110. Given Formula 1, the voltage V1 is half (½) the input voltage Vin from the solar cell 110 when the number of turns N1, N2 of the inductor L11, L12 are the same and the duty cycle Don is one third (⅓); given Formula 2, the voltage V2 is similarly half (½) the input voltage Vin from the solar cell 110 when the duty cycle Don is one third (⅓). That is, Vin=V1+V2.

Figure 5:
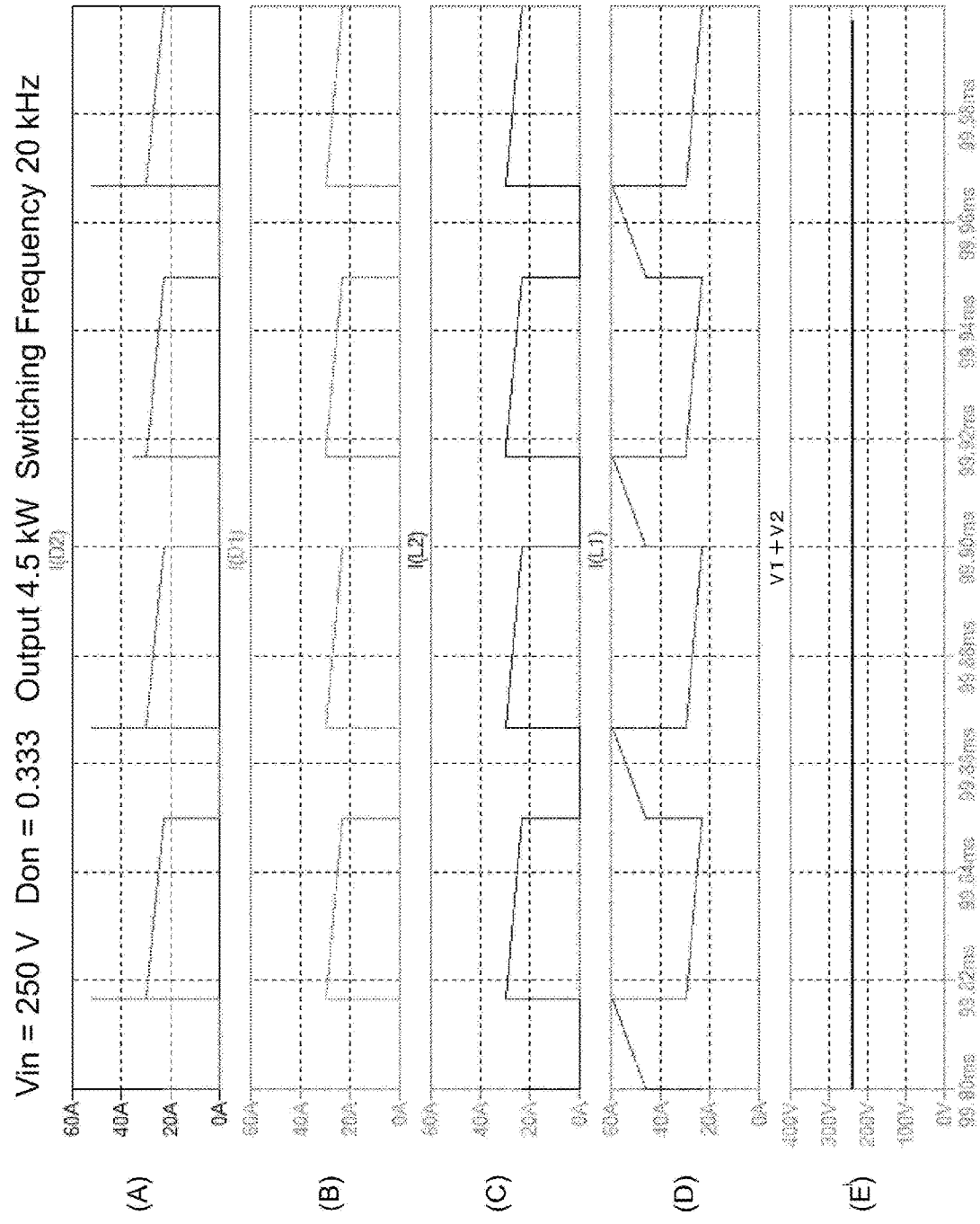
FIG. 5 illustrates an example where the duty cycle Don is ⅓.

FIG. 5 illustrates an example where the duty cycle Don is ⅓. FIG. 5(A) shows a waveform of the current passing through the diode D2; FIG. 5(B) shows a waveform of the current passing through the diode D1; FIG. 5(C) shows a waveform of the current passing through the inductor L12; FIG. 5(D) shows a waveform of the current passing through the inductor L11; and FIG. 5(E) shows the output voltage V1+V2. In the example illustrated in FIG. 5, the input voltage Vin is 250 V and the switching frequency of the switching element S1 is 20 kHz. Hereby, the output voltage V1+V2 is 250 V and equal to the input voltage Vin when the input voltage Vin is 250 V and the duty cycle Don is ⅓.

Additionally, from Formula 1 and Formula 2, the output voltage V1+V2 is larger than the input voltage Vin when given V1 equal V2 and Don is greater than ⅓. That is, Vin is less than V1+V2 allowing for an increase in the input voltage Vin.

Figure 6:
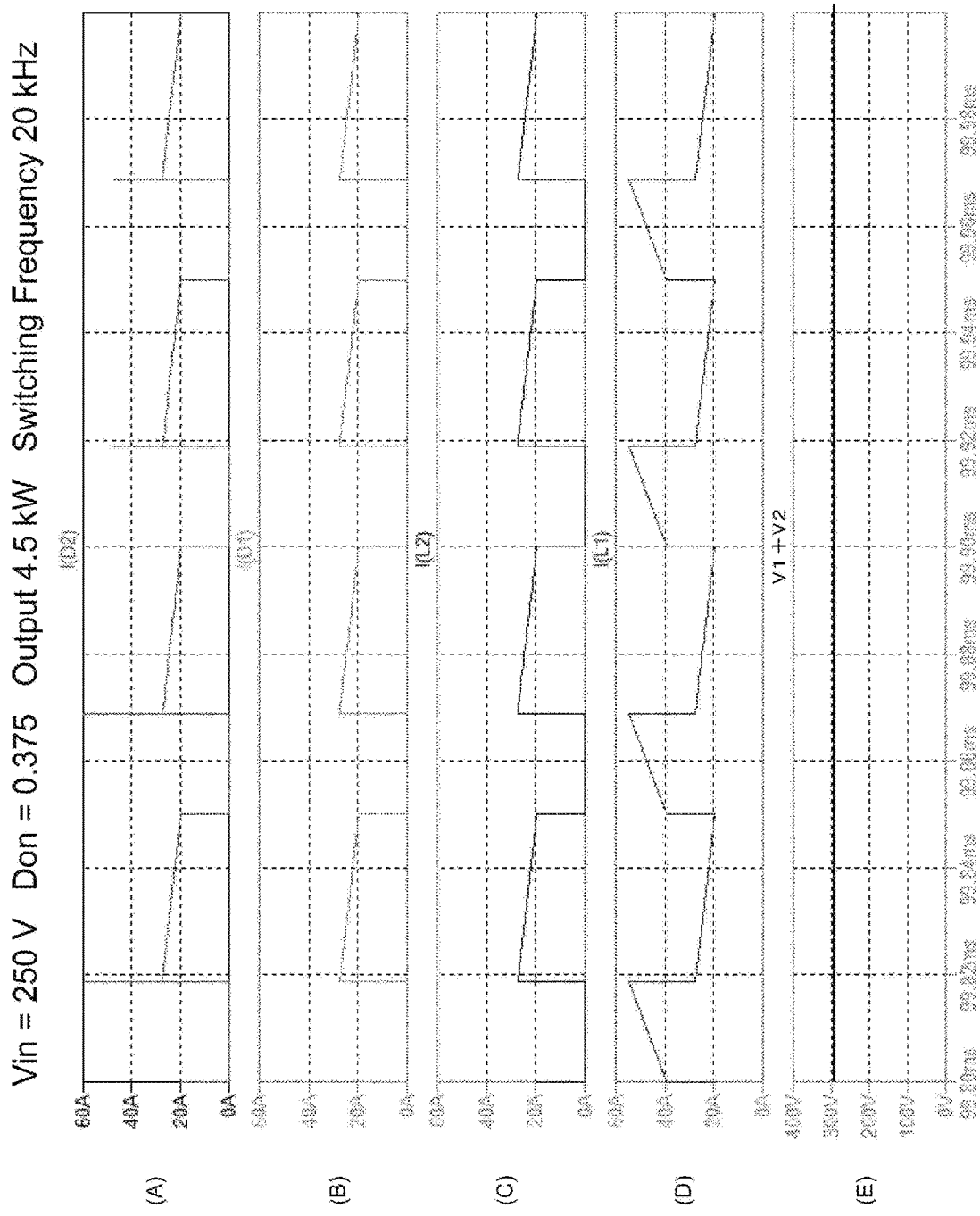
FIG. 6 illustrates an example where the duty cycle Don is 0.375.

FIG. 6 illustrates an example where the duty cycle Don is 0.375. FIG. 6(A) shows a waveform of the current passing through the diode D2; FIG. 6(B) shows a waveform of the current passing through the diode D1; FIG. 6(C) shows a waveform of the current passing through the inductor L12; FIG. 6(D) shows a waveform of the current passing through the inductor L11; and FIG. 6(E) shows the output voltage V1+V2. As in the example in FIG. 5, in the example illustrated in FIG. 6, the input voltage Vin is 250 V and the switching frequency of the switching element S1 is 20 kHz. Hereby, the output voltage V1+V2 is 300 V and greater than the input voltage Vin when the input voltage Vin is 250 V and the duty cycle Don is 0.375.

Additionally, from Formula 1 and Formula 2, the output voltage V1+V2 is smaller than the input voltage Vin when V1 equal V2 and Don is less than ⅓. That is, Vin is greater than V1+V2 allowing for a decrease in the input voltage Vin.

Figure 7:
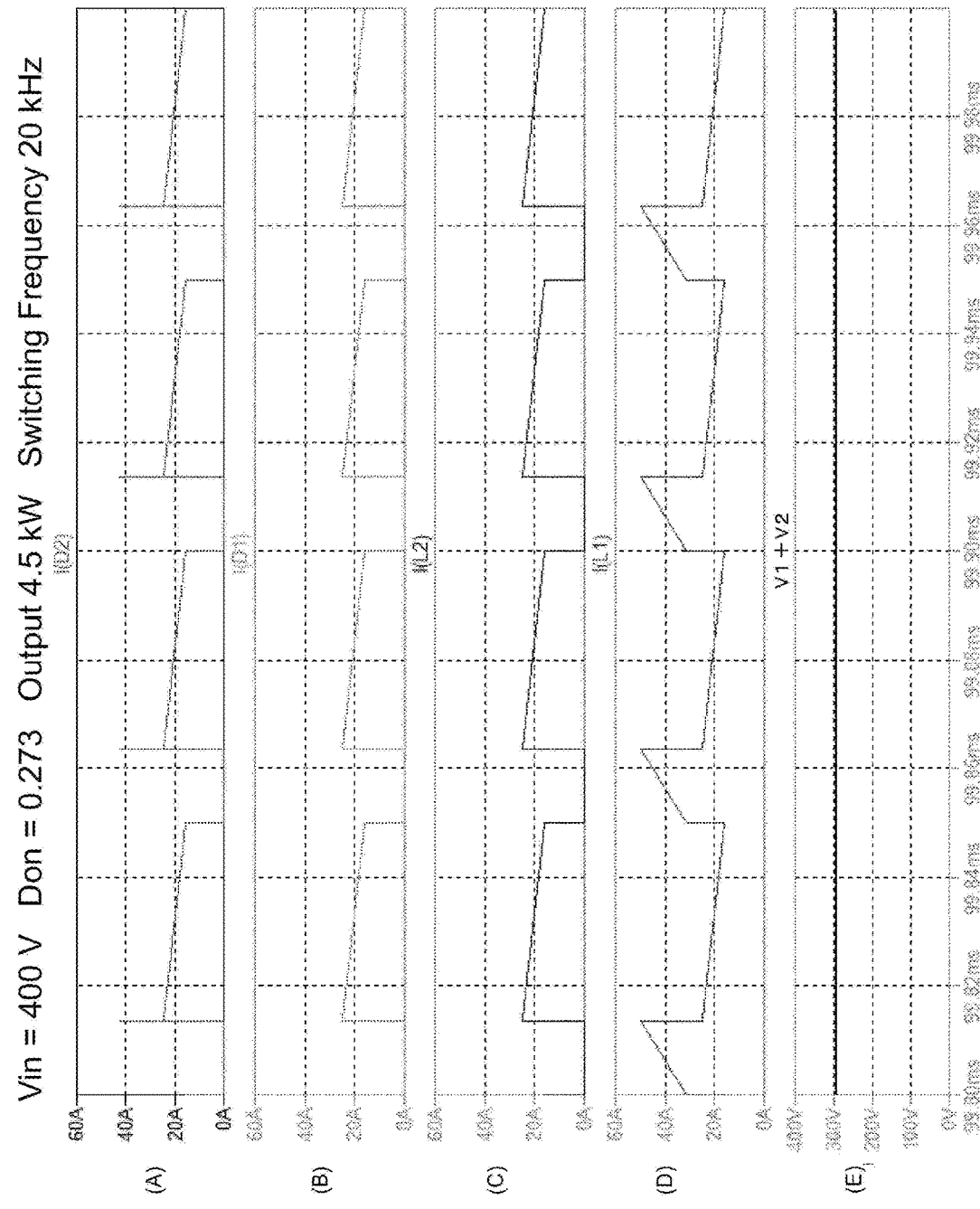
FIG. 7 illustrates an example where the duty cycle Don is 0.273.
Figure 8:
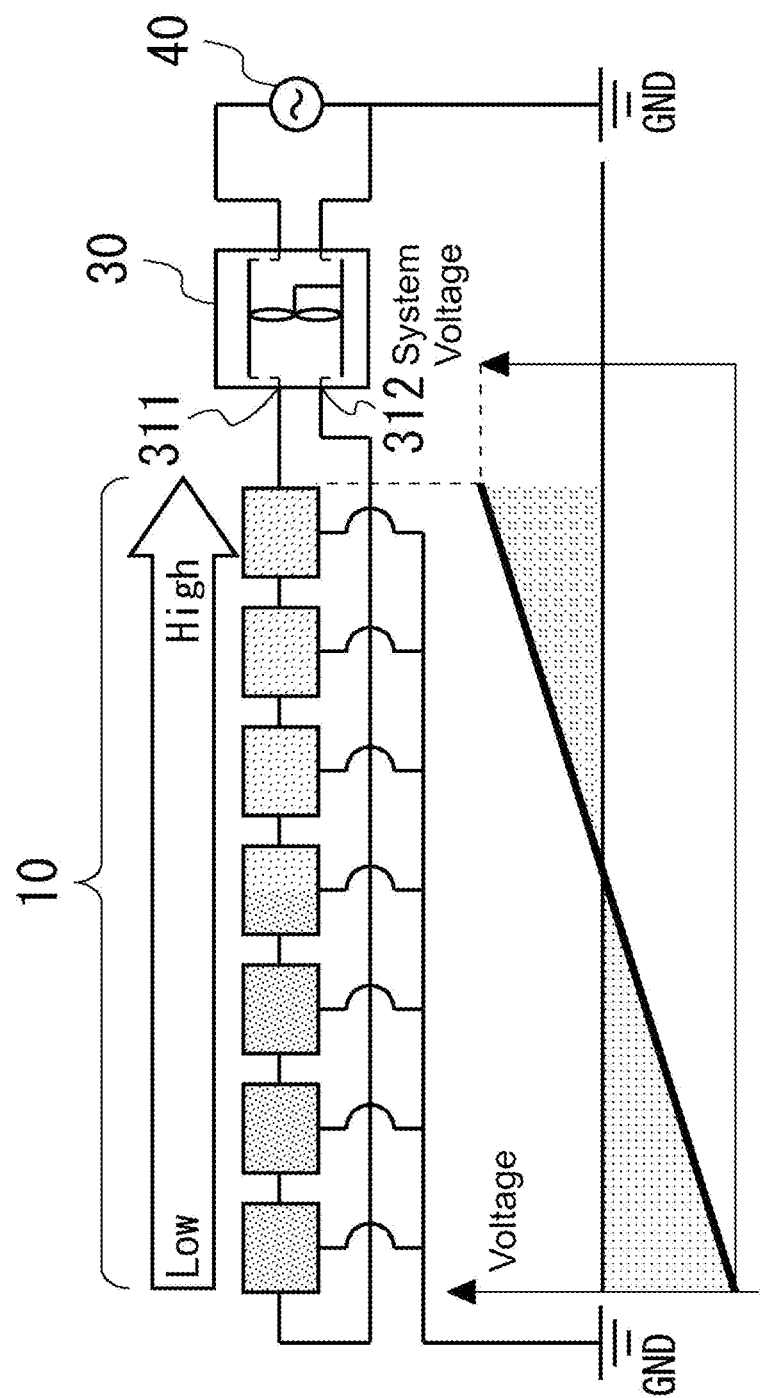
FIG. 8 is a conceptual diagram for describing one example of the PID phenomenon.

FIG. 7 illustrates an example where the duty cycle Don is 0.273. FIG. 7(A) shows a waveform of the current passing through the diode D2; FIG. 7(B) shows a waveform of the current passing through the diode D1; FIG. 7(C) shows a waveform of the current passing through the inductor L12; FIG. 7(D) shows a waveform of the current passing through the inductor L11; and FIG. 7(E) shows the output voltage V1+V2. In the example illustrated in FIG. 7, the input voltage Vin is 400 V and the switching frequency of the switching element S1 is 20 kHz. Hereby, the output voltage V1+V2 is approximately 300 V and lower than the input voltage Vin when the input voltage Vin is 400 V and the duty cycle Don is 0.273.

A power system 100 according to the embodiment may thus be provided with a DC-DC converter 31 capable of a configuration that increases the input voltage Vin and a configuration that decreases the input voltage Vin, and thereby improves the flexibility of designing the system. In other words, it is possible to have a configuration that converts the input voltage Vin to a predetermined voltage in accordance with the number of modules of solar cells 110 or the component specifications of the grid.

Additionally, the power conditioner disclosed in Patent Document 1 is configured to increase the input voltage and supply the increased voltage to an inverter, and thus cannot reduce the input voltage. However, the power conditioner 30 according to the embodiment is capable of reducing the input voltage in accordance with the duty cycle Don established for the switching element S1. It is thus possible that even if the solar cell 110 provides an increased input voltage Vin for example, using the DC-DC converter 31 to chop the input voltage can minimize the decrease in the electrical conversion efficiency.

The above-described embodiment and modifications of the present invention are merely examples, and the present invention is not limited thereto. The distinctive configurations presented in the above-described embodiment and modification examples may of course be combined insofar as the combinations do not depart from the spirit and scope of the present invention.

REFERENCE NUMERALS

1 Solar cell module
10 Solar cell string
30 Power conditioner
31 Converter
32 Inverter circuit
33 Controller
40 Distribution panel
41 Earth
100 Power system
110 Solar cell

The invention claimed is:
1. A DC-DC converter comprising:
a positive-side capacitor with one end thereof connected to a positive-electrode-side output terminal;
a negative-side capacitor with one end thereof connected to the positive-side capacitor and the other end thereof connected to a negative-electrode-side output terminal, the negative-side capacitor provided in series with the positive-side capacitor between the positive-electrode-side output terminal and the negative-electrode-side output terminal;
an inductor with one end thereof connected to the positive-electrode-side output terminal and the positive-side capacitor, and an input-side end thereof opposite to the end of the inductor coupled to the positive-electrode-side output terminal connected to the negative-electrode-side output terminal and the negative-side capacitor, the inductor including a center tap between the end coupled to the positive-electrode-side output terminal and the input-side end; and
a switching element with one end thereof connected to the input-side end of the inductor and the other end thereof connected to a positive electrode of a solar cell, the switching element controlled ON and OFF to switch between conducting and blocking a first power entering from the solar cell; wherein
a negative electrode of the solar cell is connected to a region between the positive-side capacitor and the negative-side capacitor and to the center tap of the inductor;
in response to the switching element being set to an ON state, the DC-DC converter supplies a current flowing from the solar cell to the inductor with energy accumulating in the inductor;
in response to the switching element being set to an OFF state, the DC-DC converter discharges the energy in the inductor to supply a second power to a load connected to the positive-electrode-side output terminal and the negative-electrode-side output terminal and to charge the positive-side capacitor and the negative-side capacitor; and in response to the switching element being set to an ON state, the DC-DC converter supplies the second power discharged from the positive-side capacitor and the negative-side capacitor to a load connected the positive-electrode-side output terminal and the negative-electrode-side output terminal.

2. The DC-DC converter according to claim 1, wherein a duty cycle is established for the switching element as less than a predetermined value to reduce an input voltage from the solar cell.

3. A power conditioner comprising: the DC-DC converter according to claim 2; and an inverter configured to convert direct current power supplied from the DC-DC converter to alternating current power and output the alternating current power.

4. A power system comprising: a solar cell; the DC-DC converter according to claim 2; and an inverter configured to convert direct current power supplied from the DC-DC converter to alternating current power and output the alternating current power.

5. A power conditioner comprising: the DC-DC converter according to claim 1; and an inverter configured to convert direct current power supplied from the DC-DC converter to alternating current power and output the alternating current power.

6. A power system comprising: a solar cell; the DC-DC converter according to claim 1; and an inverter configured to convert direct current power supplied from the DC-DC converter to alternating current power and output the alternating current power.

* * * * *